United States Patent
Hosek et al.

(10) Patent No.: US 8,801,069 B2
(45) Date of Patent: Aug. 12, 2014

(54) ROBOT EDGE CONTACT GRIPPER

(75) Inventors: Martin Hosek, Lowell, MA (US);
Jayaraman Krishnasamy, Billerica, MA (US); Leonard T. Lilliston, III, Roxbury, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 56 days.

(21) Appl. No.: 13/036,876

(22) Filed: Feb. 28, 2011

(65) Prior Publication Data

US 2011/0241367 A1    Oct. 6, 2011

Related U.S. Application Data

(60) Provisional application No. 61/308,449, filed on Feb. 26, 2010.

(51) Int. Cl.
*H01L 21/683* (2006.01)
*B65G 49/07* (2006.01)

(52) U.S. Cl.
USPC .................. 294/213; 294/103.1; 414/941

(58) Field of Classification Search
USPC ............. 294/103.1, 902, 213; 414/936, 941, 414/783; 211/41.18; 206/454; 901/30, 31, 901/39
See application file for complete search history.

(56) References Cited

U.S. PATENT DOCUMENTS

| | | | | |
|---|---|---|---|---|
| 4,900,214 A | * | 2/1990 | Ben ............................. | 294/103.1 |
| 5,285,600 A | * | 2/1994 | Shepley ......................... | 451/54 |
| 5,590,996 A | * | 1/1997 | Thompson et al. ......... | 294/103.1 |
| 5,810,935 A | * | 9/1998 | Lee et al. ...................... | 414/941 |
| 5,851,041 A | * | 12/1998 | Anderson et al. ............. | 294/106 |
| 5,988,191 A | * | 11/1999 | Duncan ......................... | 134/149 |
| 6,155,773 A | * | 12/2000 | Ebbing et al. ............... | 294/103.1 |
| 6,216,883 B1 | * | 4/2001 | Kobayashi et al. ........... | 414/941 |
| 6,256,555 B1 | * | 7/2001 | Bacchi et al. ................. | 294/185 |
| 6,318,949 B1 | | 11/2001 | Seaberg | |
| 6,322,312 B1 | | 11/2001 | Sundar | |
| 6,435,807 B1 | * | 8/2002 | Todorov et al. .............. | 414/936 |
| 6,454,332 B1 | * | 9/2002 | Govzman et al. ............. | 294/185 |
| 6,540,468 B1 | | 4/2003 | Blattner et al. | |
| 6,682,113 B2 | * | 1/2004 | Cox et al. ..................... | 294/104 |
| 6,769,861 B2 | * | 8/2004 | Caveney ....................... | 414/941 |
| 6,909,276 B2 | * | 6/2005 | Hofer et al. ............... | 324/750.22 |
| 7,611,182 B2 | * | 11/2009 | Kim et al. .................. | 294/103.1 |
| 7,644,968 B2 | * | 1/2010 | Hirooka et al. ............ | 294/103.1 |
| 2011/0241367 A1 | | 10/2011 | Hosek et al. | |

* cited by examiner

*Primary Examiner* — Paul T Chin
(74) *Attorney, Agent, or Firm* — Perman & Green, LLP; Colin C. Durham

(57) ABSTRACT

An apparatus for gripping a substrate on its peripheral edge including a substrate support having proximate and distal ends, at least one distal rest pad disposed at the distal end, the at least one distal rest pad includes a back stop portion and is configured to support the peripheral edge of the substrate, at least one proximate rest pad disposed at the proximate end, the at least one proximate rest pad being configured to support the peripheral edge of the substrate, and an active contact member assembly disposed at the proximate end, the active contact member assembly including a pusher member, a contact member and a rotatable coupling member that are reciprocably movable towards the distal end for urging the substrate against the back stop portion, the contact member being rotatably secured to the pusher member and free to rotate about an axis of the rotatable coupling member.

20 Claims, 10 Drawing Sheets

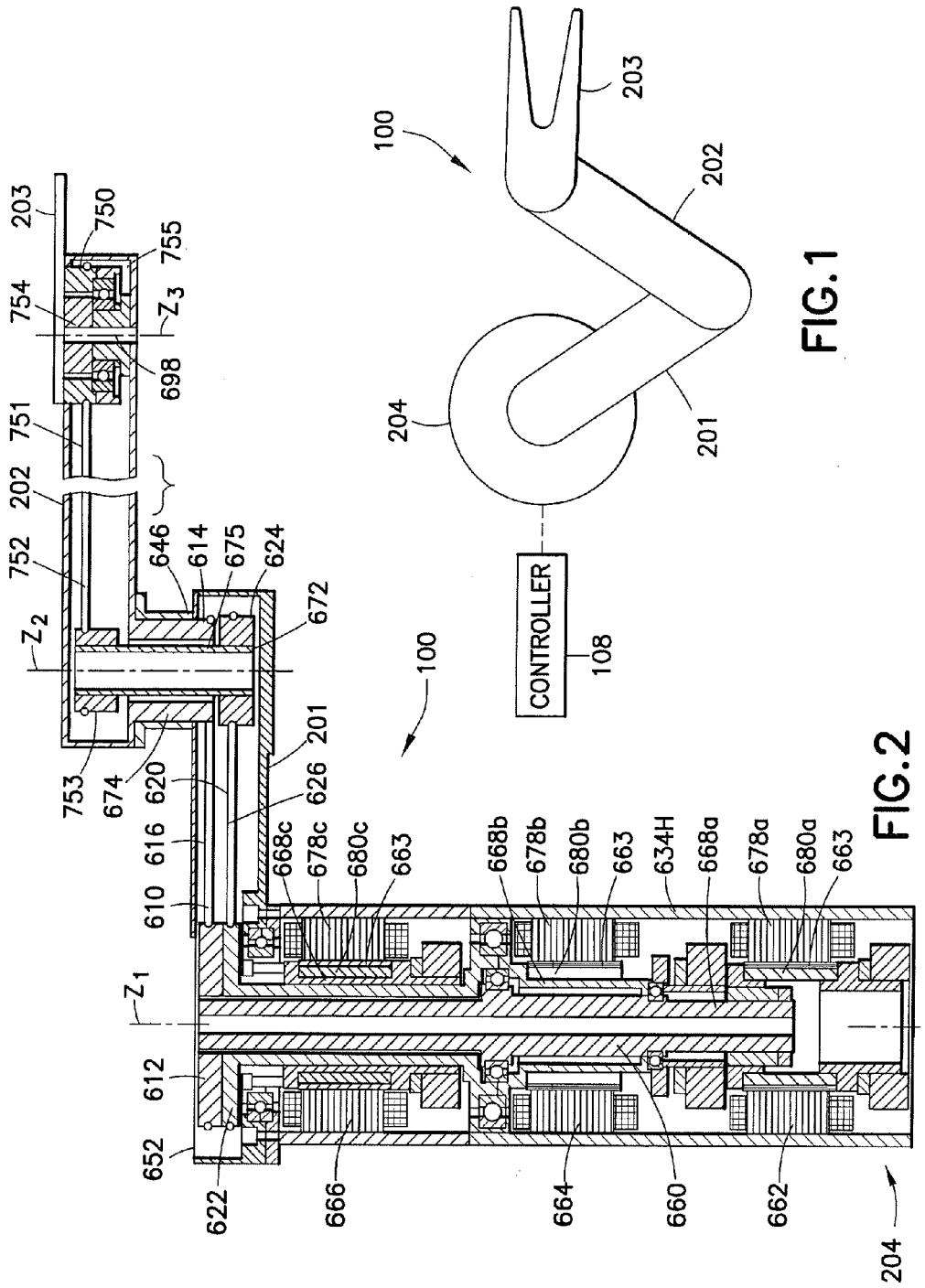

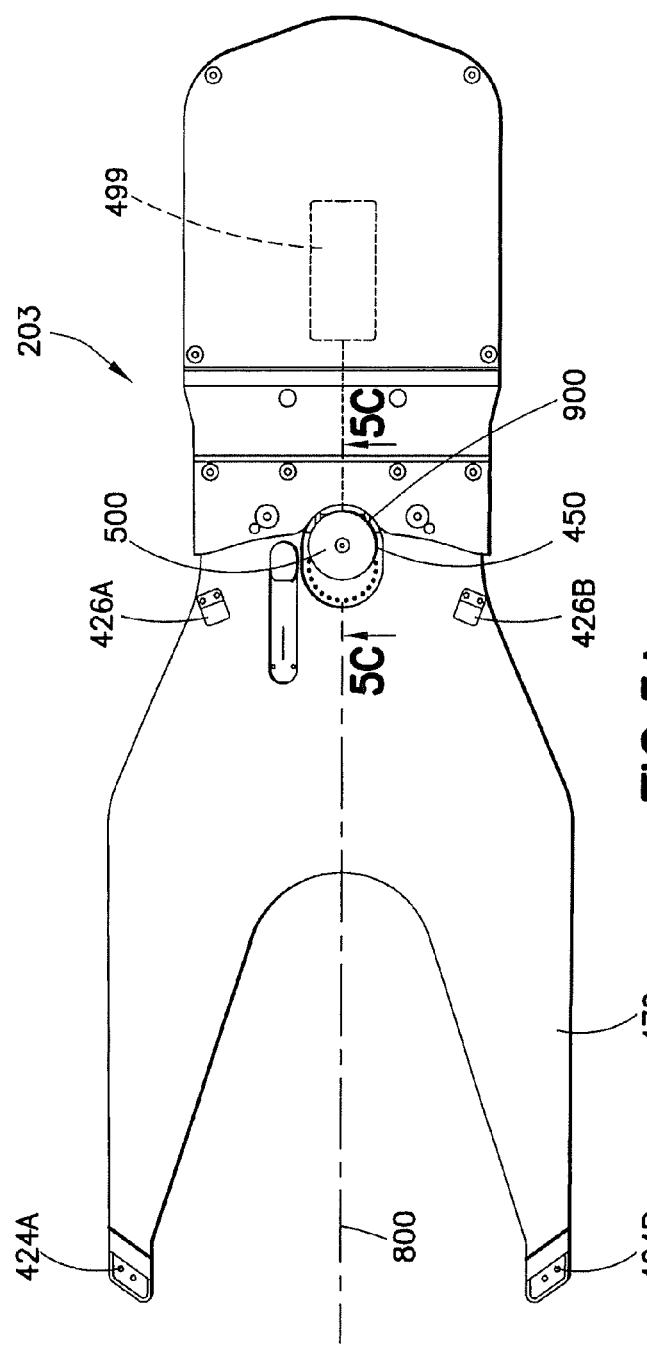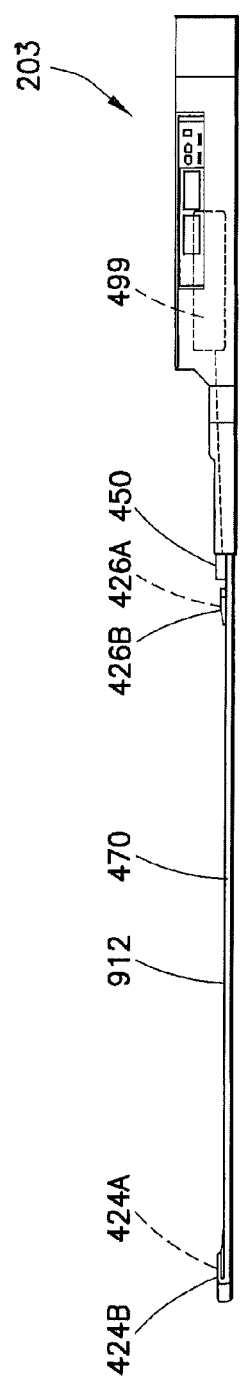
FIG.5A
FIG.5B

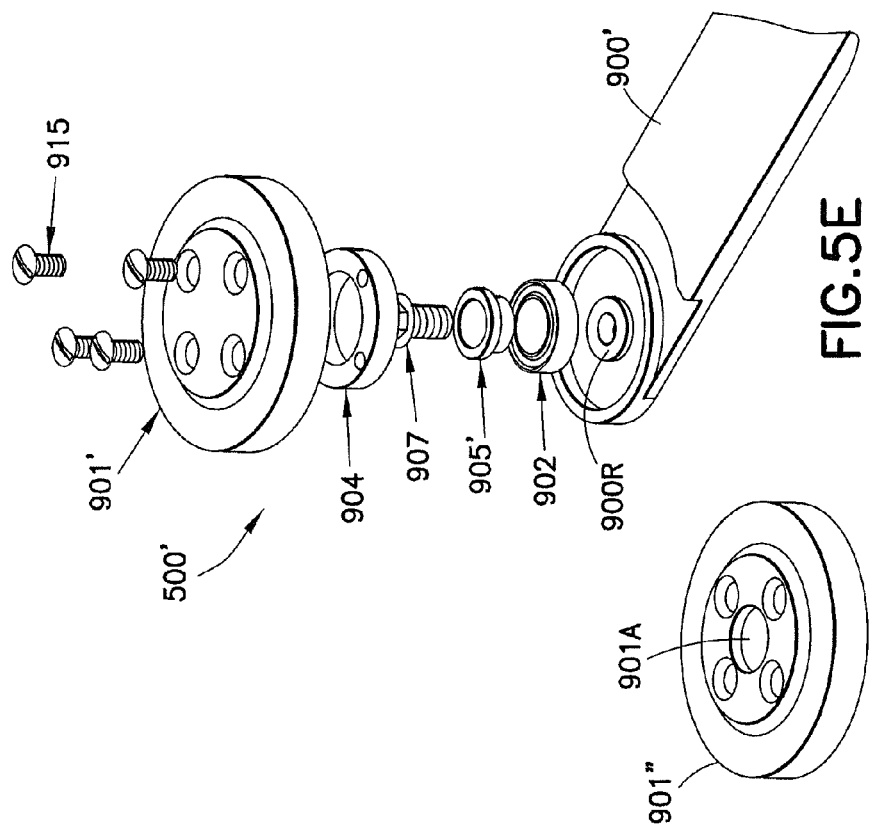
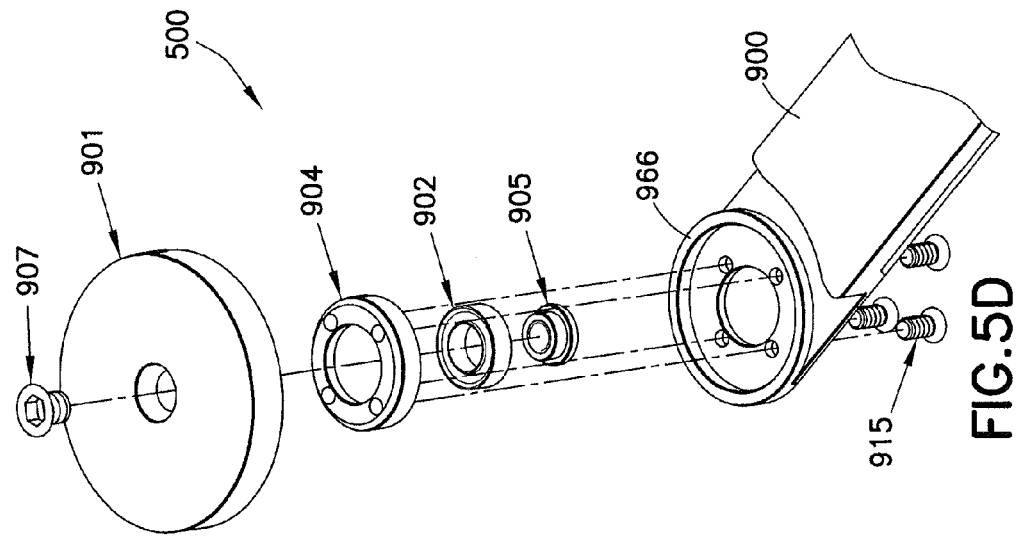

ROBOT EDGE CONTACT GRIPPER

CROSS REFERENCE TO RELATED APPLICATIONS

This application is a non-provisional of and claims the benefit of U.S. Provisional Patent Application No. 61/308,449 filed on Feb. 26, 2010, the disclosure of which is incorporated herein in its entirety.

BACKGROUND

1. Field

The exemplary embodiments generally relate to material handling devices and, more particularly, to an edge gripping robot arm end effector.

2. Brief Description of Related Developments

Generally conventional edge contact gripper designs for gripping, for example, semiconductor wafers or substrates, include a pair of front substrate rest pads with hard stops located at a distal end (e.g. the tips) of the end effector. A pair of rear substrate edge rest pads is positioned to support the other end of the substrate at the proximate end of the end effector. An active gripping member or pusher is disposed at the proximate end of the end effector and movable by, for example, a vacuum operated actuator between a retracted substrate loading position and an extended position that clamps the substrate against the hard stops at the tips of the end effector. The pusher contacts the edge of the substrate through a substantially flat slide surface incorporated into the tip of the pusher. The vacuum operated actuator includes a suitable arrangement for detecting the position of the pusher, which position is used to determine whether a substrate is present and/or properly clamped on the end effector.

When a substrate is loaded on the end effector, i.e. lifted from a substrate holding station, in an initial phase of a pick operation, the center of the substrate is typically offset from the longitudinal axis of the end effector. As the pusher extends to clamp the substrate, the substrate is pushed and slides forward toward the tips of the end effector until its edge contacts a first hard stop on one of the tips of the end effector. From this point in the pick operation, in order to properly complete the clamping phase of the pick operation, the substrate slides or rolls along the hard stop until the substrate is completely seated against the other (e.g. second) hard stop on the other tip of the end effector. In this seating process the edge of the substrate slips on the hard stop or on the flat surface of the pusher.

In order for the substrate to roll along the first hard stop, the force exerted on the substrate by the pusher generally produces a moment in the counterclockwise (or clockwise) direction so that the substrate rolls along the first hard stop until it is completely seated against the second hard stop. Similarly if the substrate contacts the second hard stop before the first hard stop the force exerted on the substrate by the pusher causes the substrate to roll along the second hard stop until the substrate is completely seated against the first hard stop. The direction of force exerted on the substrate by the pusher may be determined by the coefficient of friction between the edge of the substrate and the flat side surface of the pusher. This is generally because the force can be decomposed into a component normal to the edge of the substrate and the flat side of the pusher at the point of contact, and a frictional component tangential to the edge of the substrate and the flat side of the pusher. The ratio of the magnitude of the tangential frictional component and the normal component corresponds to the coefficient of friction.

In one example, where the first hard stop is in contact with the edge of the substrate, if the coefficient of friction increases, e.g. as a result of a contamination buildup on the flat slide surface of the pusher, the direction of the force exerted by the pusher on the substrate changes towards the point of contact between the edge of the substrate and the first hard stop. When the coefficient of friction reaches a level at which the direction of the force exerted on the substrate by the pusher passes through or to the left of the point of contact between the substrate edge and the first hard stop, the gripper locks up (e.g. stops moving such that the substrate is not properly seated or positioned on the end effector) so that the substrate will not move towards the other hard stop.

It would be advantageous to have an edge contact gripper that substantially eliminates gripper lock up problems resulting from increased friction between the pusher and the substrate edge due to, for example, contamination buildup.

BRIEF DESCRIPTION OF THE DRAWINGS

The foregoing aspects and other features of the disclosed embodiments are explained in the following description, taken in connection with the accompanying drawings, wherein:

FIG. 1 is a schematic illustration of a substrate transporter in accordance with an aspect of the invention;

FIG. 2 is a cross sectional view of the transporter of FIG. 1 showing a drive system of the transporter in accordance with an aspect of the invention;

FIG. 5A is a top schematic plan view of the end effector of FIG. 4 in accordance with an aspect of the invention;

FIG. 5B is a schematic side view of an end effector of FIG. 4 in accordance with an aspect of the invention;

FIGS. 5D-5G are illustrations of a portion of an end effector in accordance with aspects of the invention;

DETAILED DESCRIPTION

Figure 3:
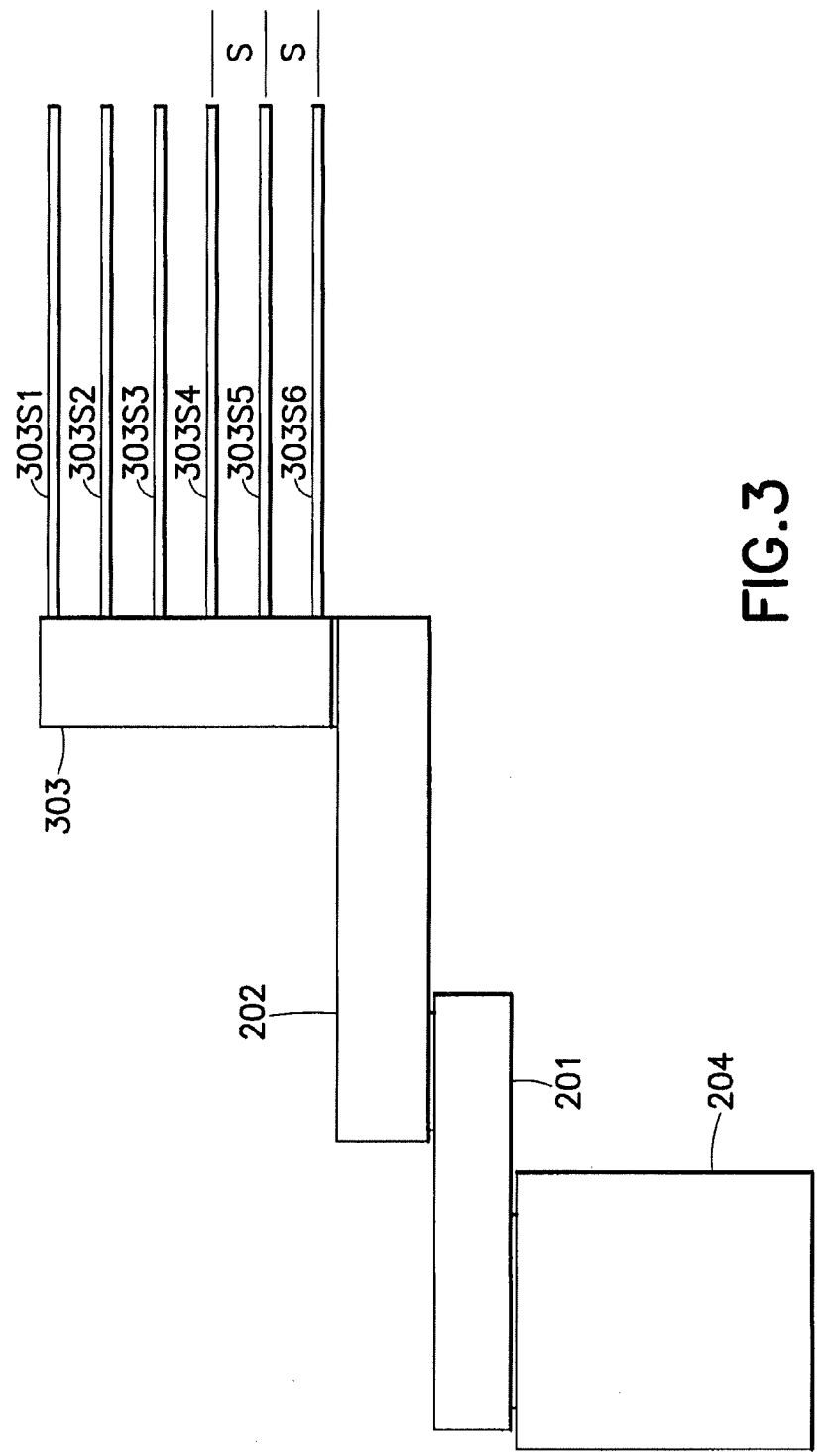
FIG. 3 is a schematic illustration of a substrate transporter in accordance with an aspect of the invention.

FIG. 1 is a schematic illustration of a substrate transporter having an edge contact gripper 203 in accordance with an aspect of the invention. Although the disclosed aspects of the invention will be described with reference to the drawings, it should be understood that the aspects of the invention can be embodied in many alternate forms. In addition, any suitable size, shape or type of elements or materials could be used.

As can be seen in FIG. 1, the substrate transporter generally comprises a SCARA arm assembly 100 with an upper arm 201, a forearm 202, a substrate holder or end effector (e.g. edge contact gripper) 203 and a drive section 204. A controller 108 may be connected to the arm assembly 100 to move the arm sections 201, 202, 203 of the assembly as desired. In other examples, the arm assembly may have any other desired general SCARA configuration. For example, the assembly may have multiple forearms and/or multiple end effectors. In still other examples, the arm assembly may be configured as a frog leg type arm assembly (4 bar linkage with single end effector or twin four bar linkage with dual side end effectors), a leap frog type arm assembly (4 bar linkage with dual same side end effectors), a dual SCARA arm type arm assembly (two independently driven SCARA arms) or any other suitable arm assembly. As may be realized, the end effector 203 disclosed herein may be incorporated into any suitable substrate transporter.

Referring also to FIG. 2, the end effector 203 is rotatably connected to the forearm 202 by shaft assembly 754 at a wrist 755 of the transporter 100. End effector 203 may be rotatably connected by support shaft 698 to the forearm 202. In this example, the end effector 203 is shown as a forked end effector, however in other examples the end effector may have any suitable configuration such as, for example a paddle configuration. The end effector 203 may have active mechanical edge gripping as will be described below. The forearm 202 is rotatably connected by a coaxial shaft assembly 675 to the upper arm 201 at elbow 646 of the transporter 100. The upper arm 201 is rotatably connected at the shoulder 652 to drive section 204.

In this example the upper arm 201, forearm 202 and end effector 203 may be independently rotatable and driven by separate motors. In other examples, one or more of the arm assembly arm sections may not be independently rotatable. For example, rotation of the end effector may be slaved such that the end effector remains substantially longitudinally aligned with an axis of extension and retraction of the arm assembly 100. In the example shown, drive section 204 may have an outer housing 634H which houses a coaxial drive shaft assembly 660, and three motors 662, 664, 666. In other examples, the drive section could have more or fewer than three motors. It should be understood that the drive section is not limited to what is disclosed herein and may include any suitable components having any suitable configuration for effecting the extension and retraction of the arm assembly 100. For example, the motors may have a side by side arrangement and/or one or more of the motors may be mounted at the shoulder, elbow and/or wrist of the arm assembly for driving a respective one of the upper arm, forearm and end effector.

In this example, the drive shaft assembly 660 has three drive shafts 668a, 668b, 668c. In other examples more or fewer than three drive shafts could be provided. The first motor 662 comprises a stator 678a and a rotor 680a connected to the inner shaft 668a. The second motor 662 comprises a stator 678b and a rotor 680b connected to the middle shaft 668b. The third motor 666 comprises a stator 678c and a rotor 680c connected to the outer shaft 668c. The three stators 678a, 678b, 678c are stationarily attached to the housing 634H at different vertical heights or locations along the housing. In this example the first stator 678a is the bottom stator, the second stator 678b is the middle stator and the third stator 678c is the top stator. Each stator generally comprises an electromagnetic coil. The three shafts 668a, 668b, and 668c are arranged as coaxial shafts. The three rotors 680a, 680b, 680c are preferably comprised of permanent magnets, but may alternatively comprise a magnetic induction rotor that does not have permanent magnets. Sleeves 663 are located between the rotor 680 and the stators 678 to allow the transporter 200 to be useable in a vacuum environment with the drive shaft assembly 660 being located in a vacuum environment and the stators 678 being located outside of the vacuum environment. However, the sleeves 663 need not be provided if the transporter 200 is only intended for use in an atmospheric environment.

The first shaft 668a is the inner shaft and extends from the bottom stator 678a. The inner shaft has the first rotor 680a aligned with the bottom stator 678a. The middle shaft 668b extends upward from the middle stator 678b. The middle shaft has the second rotor 680b aligned with the second stator 678b. The outer shaft 668c extends upward from the top stator 678c. The outer shaft has the third rotor 680c aligned with the upper stator 678c. Various bearings are provided about the shafts 668 and the housing 634H to allow each shaft to be independently rotatable relative to each other and the housing 634H. Each shaft 668 may be provided with a suitable position sensor to signal the controller 208 (see FIG. 5) of the rotational position of the shafts 668 relative to each other and/or relative to the housing 634H. Any suitable sensor could be used, such as an optical or induction sensor.

The outer shaft 668c is fixedly connected to the upper arm 201 so that shaft 668c and upper arm 201 rotate together as a unit about axis Z1. The middle shaft 668b is connected to a first transmission 620 in the upper arm 201 and the inner shaft 668a is connected to a second transmission 610 in the upper arm 201 as shown in FIG. 2. The first transmission 620 preferably comprises a drive pulley 622, an idler pulley 624 and drive cables or belts 626. The drive pulley 622 is fixedly mounted to the top of the middle shaft 668b and is connected by drive belt 626 to the idler pulley 624. The idler pulley 624 is fixedly mounted to the bottom of the inner shaft 672 of coaxial shaft assembly 675 connecting the forearm 202 to the upper arm 201. The second transmission 610 in the upper arm 201 preferably comprises a drive pulley 612, an idler pulley 614 and drive belts or cables 616. Drive pulley 612 is fixedly mounted to the top of the inner shaft 668a of coaxial shaft assembly 660 in drive section 204. The idler pulley 614 is fixedly mounted to the bottom of the outer shaft 674 of the coaxial shaft assembly connecting the forearm 202 to the upper arm 201. Drive belt 616 connects the drive pulley 612 to the idler pulley 614. The diameter ratio between the idler and drive pulleys 624, 622 of the first transmission 626 and between the idler and drive pulleys 614, 612 of the second transmission 610 in this example is about 1 to 1, though in other examples the ratio between the idler and drive pulleys may be as desired. The drive belts 616, 626 are configured to rotate the respective idler pulleys 614, 624 in the same direction as the corresponding drive pulley 612, 622 (e.g. clockwise rotation of drive pulleys 612, 622 causes clockwise rotation of idler pulleys 614, 624).

The coaxial shaft assembly 675 connecting the forearm 202 to the upper arm 201 is rotatably supported from the upper arm 201 by suitable bearings which allow the outer and inner shafts 674, 672 of the shaft assembly to rotate about axis Z2 relative to each other and to the upper arm 201. The outer shaft 674 of coaxial shaft assembly 675 is fixedly mounted to the forearm 202 so that the shaft 674 and forearm 202 rotate together as a unit about Z2. The forearm 202 is rotated about axis Z2 when the idler pulley 614 of the second transmission 610 in the upper arm 201 is rotated by inner shaft 668a of drive section 204. Thus, the inner shaft 668a of drive section 204 is used to independently rotate forearm 202 relative to the upper arm 201.

The inner shaft 672 of the coaxial shaft assembly is fixedly attached to drive pulley 753 of a third transmission 752 in the forearm 202. The third transmission 752 in the forearm 202 preferably comprises drive pulley 753, an idler pulley 750 and drive belts or cables 751. Idler pulley 750 is fixedly mounted to shaft 698. Drive belt 751 connects the drive pulley 753 to idler pulley 750. Shaft 698 is rotatably supported from the forearm 202 by suitable bearings that allow the shaft 698 to rotate about axis Z3 relative to the forearm 202. The diameter ratio between the idler and drive pulleys 750, 753 of the third transmission 752 in this example is about 1 to 1, though in other examples the ratio between the idler and drive pulleys may be as desired. The drive belts 751 are configured to rotate the idler pulley 750 in the same direction as the drive pulley 753 (e.g. clockwise rotation of drive pulley 753 causes clockwise rotation of idler pulley 750).

Shaft 698 is fixedly mounted to the end effector 203. Thus, the shaft 698 and end effector 203 rotate together as a unit about axis Z3. The end effector 203 is rotated about axis Z3 when idler pulley 750 of the third transmission 752 is rotated by drive pulley 753. Drive pulley 753 in turn is rotated by inner shaft 672 of the coaxial shaft assembly 675. Inner shaft 672 is rotated when idler pulley 624 of the first transmission 626 in the upper arm 201 is rotated by middle shaft 268b of drive section 204. Hence, the end effector 203 may be independently rotated with respect to forearm 202 and upper arm 201 about axis Z3.

While FIGS. 1 and 2 show the transporter having an end effector 203 with a single substrate support, it should be realized that the end effector may be configured as a batch loading end effector. For example, referring to FIG. 3, the end effector 303 may include one or more substrate supports 303S1-303S6, each configured to grip and hold a substrate as will be described below. While the end effector 303 is shown in this example, has having six substrate supports 303S1-303S6, in other aspects of the invention the end effector may have any suitable number of substrate supports. The end effector 303 may be a modular end effector such that substrate supports may be added and/or removed so that the end effector can be configured with any desired number of substrate holders. The end effector 303 may be configured such that the spacing S between the substrate supports 303S1-303S6 allows for multiple substrate picks/places at suitable substrate holding locations. In one example, the spacing between the substrate supports 303S1-303S6 may be about 10 mm. In other examples the spacing between the substrate supports may be any suitable spacing for enabling multiple substrate picks/places in high throughput/capacity substrate processing/holding systems. For example, a substrate cassette, such as a front opening unified pod (FOUP) or other suitable substrate cassette, may be configured to hold substrates spaced apart by a predetermined distance, such as for example, the 10 mm spacing described above. The spacing between the substrate holders 303S1-303S6 of the end effector 303 may be configured to allow multiple substrate holders 303S1-303S6 to enter a corresponding number of substrate holding slots within, for example, the substrate cassette (or other substrate holding location) for removing or inserting substrates from/into the substrate cassette.

Figure 4A:
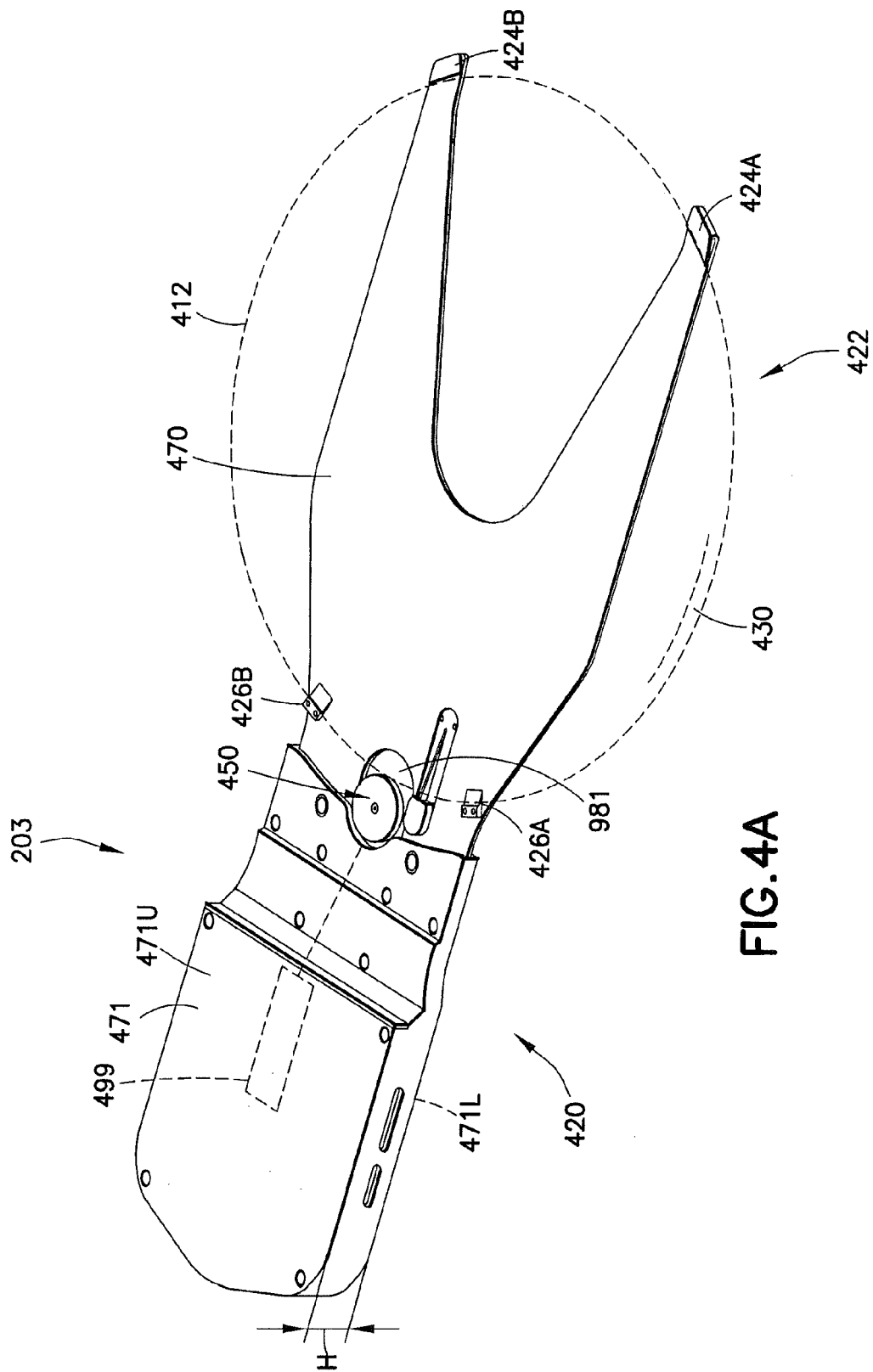
FIG. 4A is a schematic isometric view of an end effector of the substrate transporter of FIG. 1 in accordance with an aspect of the invention.
Figure 4B:
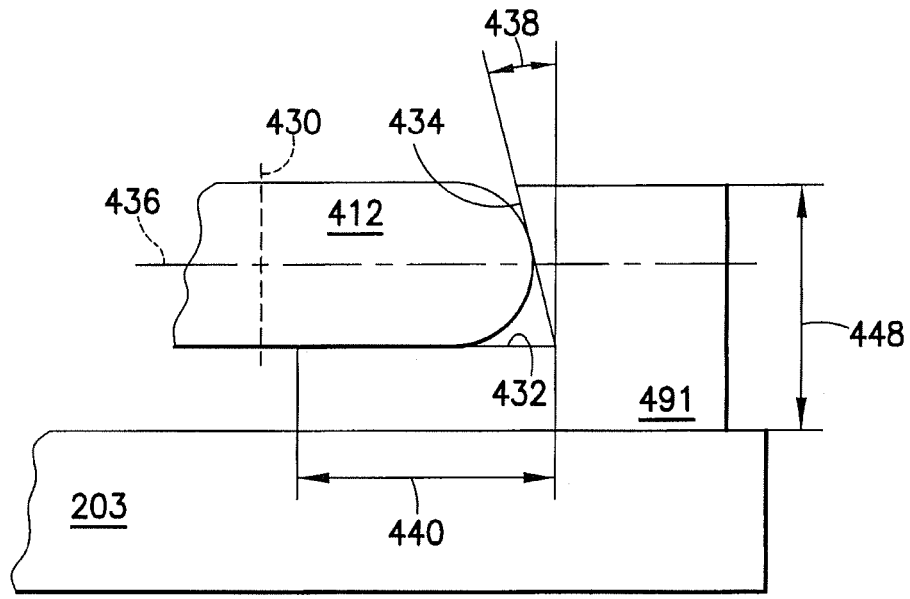
FIGS. 4B and 4C are schematic illustrations of exemplary substrate support pads of the transporter of FIG. 1.
Figure 4C:
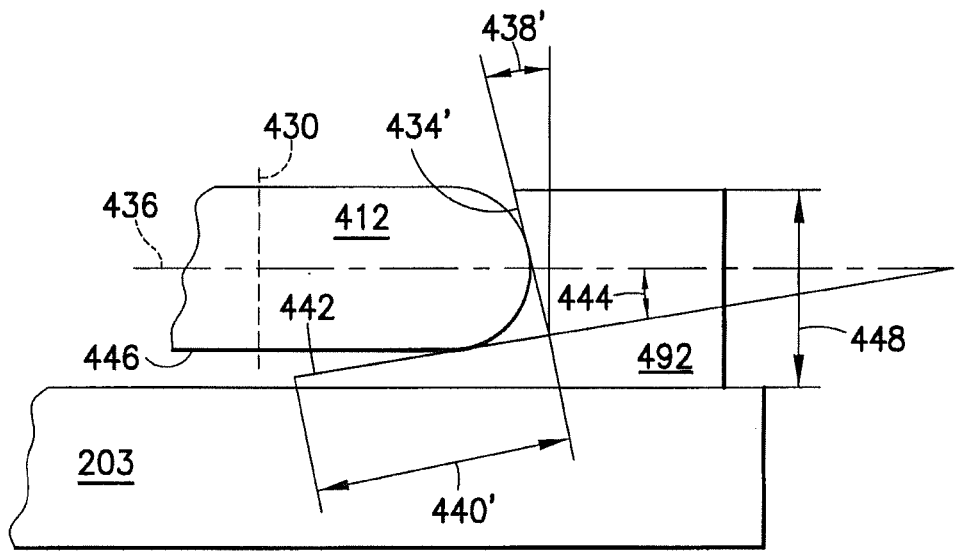

Referring now to FIGS. 4A-4C the substrate support and gripper of, for example, the end effector 203 will be described. It should be understood that each of the substrate supports 303S1-303S6 of the batch loading end effector 303 may have a substantially similar configuration to that described with respect to end effector 203.

The end effector 203 includes a longitudinally elongated base or substrate support 470 having a distal end 422 and a proximate end 420. The substrate support 470 is coupled to a base member 471 in any suitable manner. As can be seen in FIG. 4A, the base member 471 may be configured such that the substrate support extends from a position that is offset relative to the height H of the base member 471. For example, the base member 471 may include a top or upper surface 471U and a bottom or lower surface 471L. In the example shown in FIG. 4A the substrate support may extend from the base member adjacent the bottom surface 471L. In other examples, the substrate support may extend from the base member adjacent the top surface 471 or from an area of the base member located between the top and bottom surfaces 471U, 471L. As described above, the end effector 203 is operably coupled to the substrate transport arm assembly 100 (FIG. 1) at a proximal end 420. The end effector 203 receives substrates between the proximal end 420 and distal end 422 and includes at least two rest pads fixed to the base 470 upon which the substrate 412 is initially loaded. In this example, the end effector 203 includes two distal rest pads 424A, 424B located at, or adjacent to, the distal end 422 or tip of the end effector 203. In this example, the base 470 is shown as having a forked shape such that one distal rest pad is located on one tine of the fork while the other distal rest pad is located on the other tine of the fork. Two proximate rest pads 426A, 426B are located on the base 470 towards the proximate end 420 of the end effector 203. In other examples the distal and proximate rest pads may each be formed as a single arcuate rest pad having an angular extent greater than the length of a "flat" or "fiducial," which is a grain orienting indicating feature commonly found on, for example, semiconductor wafers.

The distance between the rest pads 424A, 424B and 426A, 426B may each have an angular extent greater than any feature on the substrate 412 to substantially ensure that the substrate 412 is gripped only within an exclusion zone 430 (a portion of which is shown in dashed lines) of the substrate 412. The exclusion zone 430 may be disposed around an edge of the substrate 412 and extend inwards towards a center of the substrate a predetermined distance for providing an area for the substrate to be handled. The rest pads 424A, 424B, 426A, 426B may be made of any suitable material adapted to work in any suitable predetermined operational environment, such as in high temperature applications.

FIG. 4B illustrates one example of a rest pad 491. In this example, the rest pad 491 may be configured as a substantially flat rest pad suitable for use with substrates having any suitable diameter such as, for example, a 200 mm, 300 mm, 450 mm or larger diameter substrates. The rest pad 491 includes a pad portion 432 and a backstop portion 434. In this example, the pad portion 432 may be substantially parallel to an imaginary plane 436 extending through wafer 412, and back stop portion 436 may be inclined toward wafer 412 at a backstop angle 438 of up to about 5 degrees relative to a line perpendicular to plane 436. In other examples, the pad portion 432 may be inclined away from the wafer 412 up to about 3 degrees relative to the plane 436. Pad portion 432 may have a length 440 that is a function of the depth of the exclusion zone 430 of the substrate 412, but may be, for example, about 3 mm long. Substrate 412 typically has a substantially rounded peripheral edge and contacts rest pad 491 only within the exclusion zone 430. The substrate 412 may be gripped by urging the substrate 412 into the included angle formed between the pad portion 432 and backstop portion 434 of rest pad 491.

FIG. 4C illustrates another example of a rest pad 492. In this example, the rest pad 492 may be configured as an inclined rest pad that may be suitable for use with substrates having any suitable diameter such as, for example, a 200 mm, 300 mm, 450 mm or larger diameter substrates. In this example, the rest pad 492 includes an inclined pad portion 442 and a backstop portion 434'. The inclined pad portion 442 may be inclined away from the substrate 412 at a rest pad angle 444 of about 3 degrees relative to plane 436, and backstop portion 434' may be inclined toward substrate 412 at a backstop angle 438' of up to about 3 degrees. Inclined pad portion 442 may have a length 440' that is a function of the depth of the exclusion zone 430, but may be, for example, about 3 mm long. As described above, the substrate 412 may be gripped by urging the substrate 412 into the included angle formed between the pad portion 442 and the backstop portion 434'. In this example, there is substantially no contact between the rest pad 492 and a bottom surface 446 of the substrate 412.

Both rest pads 491, 492 have a height 448 that substantially reaches but does not extend beyond a top surface of the substrate 412. The height of the rest pads 491, 492 may also be configured to allow multiple substrates to be simultaneously picked or placed as described above with respect to the batch loading end effector of FIG. 3.

As may be realized, the proximate and distal rest pads 424A, 424B, 426A, 426B may be substantially similar to rest pad 491 and/or rest pad 492, except that each of the proximate rest pads 426A, 426B do not necessarily require a backstop portion and the pad portion of the proximate rest pads 426A, 426B may have a length of about twice that of length 440 to allow for movement of the substrate 412 towards the distal end of the end effector 203 during gripping of the substrate 412. In other examples the pad portion of the proximate rest pads 426A, 426B may have any suitable length.

Figure 5C:
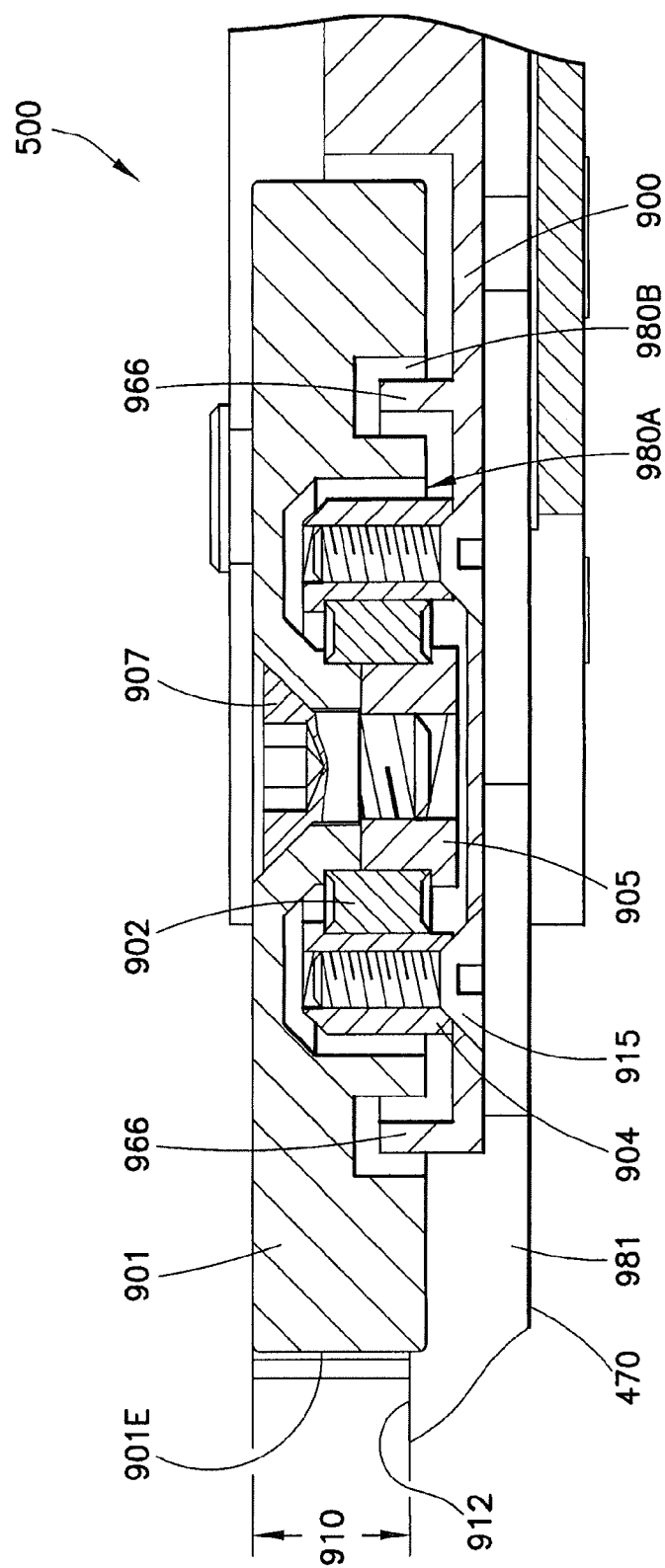
FIG. 5C is a cross sectional view of a portion of the end effector of FIG. 4 in accordance with an aspect of the invention.
Figure 5G:
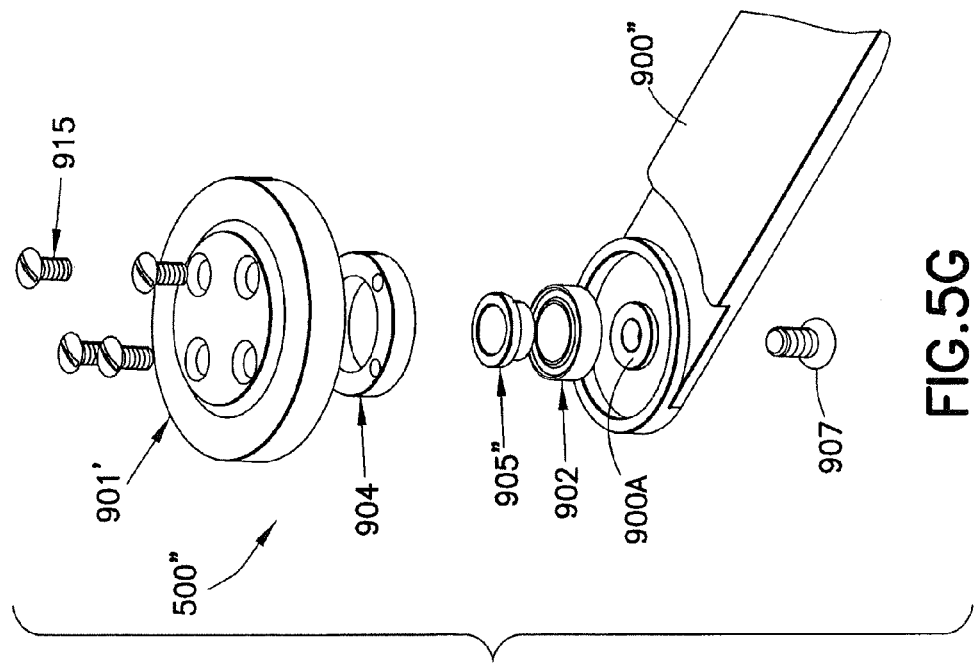

Referring also to FIGS. 5A-5C, the end effector 203 also includes an active contact point 450 that is located at the proximate end 420 of the end effector 203 substantially between proximate rest pads 426A, 426B. The active contact point 450 may be movable between a retracted substrate loading position (shown in FIG. 5A) and an extended substrate gripping position (shown in dashed lines in FIG. 5A). The active contact point 450 may be configured to urge the substrate 412 against the stop surface(s) of the distal rest pad 424A, 424B for gripping the substrate 412.

The active contact point 450 may be operatively connected to any suitable actuator or drive system 499 for effecting movement of the contact point 450 between the substrate loading and gripping positions. In one example, the actuator 499 may be a vacuum operated actuator. In another example, the actuator may be an electrically operated actuator. In still other examples, the actuator may be operable in any suitable manner for effecting movement of the contact point 450 between the substrate loading and gripping positions. One exemplary actuator for moving the contact point 450 is described in U.S. Pat. No. 6,256,555, which is incorporated herein by reference in its entirety.

Figure 7:
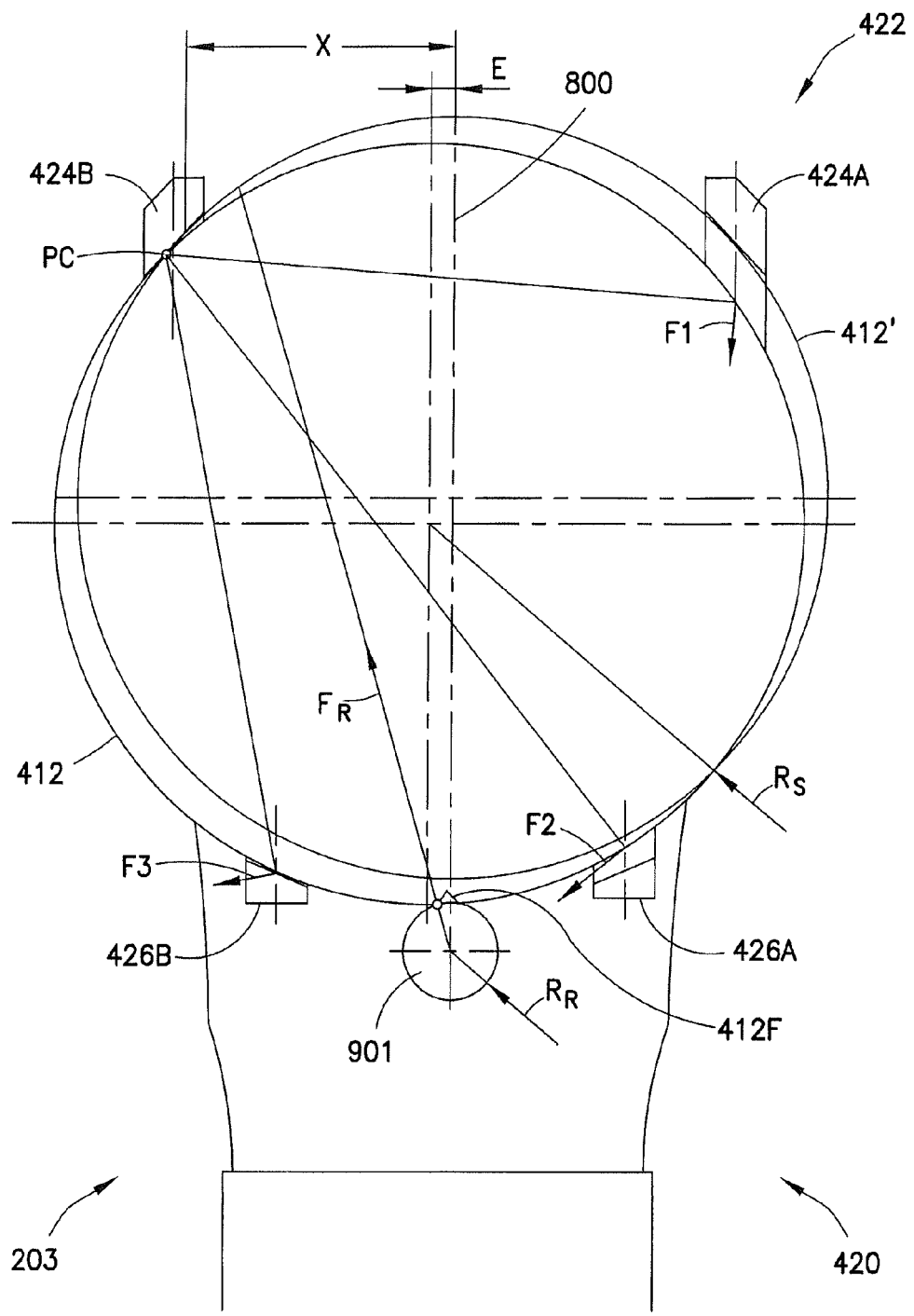
FIG. 7 is a schematic illustration of a substrate disposed on the end effector of FIG. 1 in accordance with an aspect of the invention.

The contact point 450 may include a roller arrangement 500. The roller arrangement 500 may be configured to substantially eliminate the friction lock up of the gripper experienced with the flat side surface of the conventional pusher described above. For example, the rotational resistance associated with the operation of the roller arrangement 500 is substantially negligible and substantially independent of the contact force between the roller arrangement 500 and the substrate 412. The roller arrangement 500 may include a pusher 900 and a roller 901. The pusher 900 may be coupled to the actuator 499 in any suitable manner and be positioned within or on a surface of the end effector 203 so that the actuator 499 effects reciprocal movement of the pusher along a longitudinal axis 800 of the end effector 203. The roller 901 may have a general disc shape with an outer peripheral edge surface 901E. The outer peripheral edge surface 901E may have any suitable contour configured to accommodate variations in the substrate elevation as the substrate slides on the rest pads 426A, 426B, 424A, 424B during the substrate gripping process. In one example, the outer peripheral edge surface 901E may have a substantially flat contour. In alternate embodiments the outer peripheral edge surface 901E may have a concave contour configured to support a proximate edge of the substrate 412 at a predetermined elevation when the substrate is gripped by the end effector 203. In other alternate embodiments the outer peripheral edge surface 901E of the roller 901 may have any suitable contour. The roller 901 may also have any suitable radius $R_R$ (FIG. 7). For example, the radius $R_R$ of the roller 901 may be such that the roller straddles a width of a fiducial 412F (FIG. 7) disposed on the peripheral edge of the substrate by a predetermined amount for allowing the roller 901 and substrate 412 to rotate relative to one another (when the roller 901 is in substantial contact with the peripheral edge of the substrate 412) substantially without interruption by the passage of the fiducial 412F over the roller 901.

Referring also to FIG. 5D, the roller 901 may be rotatably coupled to the pusher 901 in any suitable manner such as by ball bearing 902. For exemplary purposes only, the outer race of the bearing 902 may be fixed to the pusher 900 by an outer retention ring 904. The outer retention ring 904 may be fixed to the pusher 900 in any suitable manner such as by suitable mechanical fasteners 915. In alternate embodiments chemical fasteners may be used to fix the outer retention ring to the pusher. The inner race of the bearing 902 may be mated to the roller 901 through inner retention ring 905. A keyed interface may exist between the roller 901 and the inner retention ring 905 to substantially prevent relative rotation between the roller 901 and the inner retention ring 905. The roller 901 may be mounted to the pusher in any suitable manner such as with one or more fasteners. The fastener(s) may be for example, screws, clips, pins or any other suitable retention device(s). In this example, a single fastener 907 may hold the roller 901 in place on the pusher 900. For example, the fastener 907 may extend through the roller 901 and engage, for example, the inner retention ring 905 in any suitable manner so that the inner race of the bearing is sandwiched between the roller 901 and the inner retention ring 905. Because the roller 901 and inner retention ring 905 are fixed to the inner race of the bearing, the roller 901, inner retention ring 905 and fastener 907 are free to rotate as a unit. As may be realized, the keyed interface between the roller 901 and the inner retention ring 905 may substantially prevent rotation of the inner retention ring while the fastener 907 is being secured. As may also be realized, the keyed interface and single fastener arrangement may facilitate easy removal and replacement of the roller 901 when the transporter is operable (e.g. in service) in the field. As may be realized, the roller arrangement 500 may be configured such that the roller 901 may be removed from, for example, the pusher 900 through the removal of a single fastener 907 from a top side of the end effector (e.g. the side of the end effector on which the rest pads 426A, 426B, 424A, 424B are located). As may also be realized, when the roller 901 is removed the roller bearing assembly 902, 904, 905 may remain attached to the pusher 900 with the fasteners 915. The roller bearing assembly may be removed from the pusher by removing the fasteners 915 from the underside or bottom side of the end effector. As may be realized, the roller arrangement 500 may also be removed from the pusher 900 (and the end effector) as a unit (e.g. with the roller 901 mounted to the roller assembly 902, 904, 905) by removing the fasteners 915.

Referring to FIG. 5E, another example, of a roller arrangement 500' is shown. The roller arrangement 500' may be substantially similar to roller arrangement 500 described above, except where otherwise noted. In this example, the fasteners for holding the roller and bearing assembly to the pusher can be removed from a common side of the end effector, which in this example is the top side of the end effector. The bearing assembly 902, 904, 905' may be mounted to the pusher 900' using fastener 907 which is inserted through the inner retention ring 905', from the top side of the end effector, to engage corresponding retaining features 900R (e.g. threads, clips, etc.) of the pusher 900'. The roller 901' may be mounted to the bearing assembly using fasteners 915 which engage corresponding retaining features located in the outer retention ring 904. As may be realized, the roller 901' and the bearing assembly 902, 907, 905' may be removed from the pusher 900' separately. In other examples, referring to FIG. 5F, the roller 901" may have an aperture 901A located in a central portion of the roller 901" such that the fastener 907 can be passed through the aperture 901A while the roller 901" is mounted to the outer retention ring 904. It is noted that any suitable cap may be placed on the roller 901" to seal the aperture 901A to seal the bearing assembly from, for example, an environment in which the end effector is located. The bearing 902 may also be a sealed bearing with suitable shields to prevent particles from emanating from the bearing where a cap for sealing the aperture is not used. In this manner the roller 901" and the bearing assembly 902, 904, 905' may be removed from the pusher 900' (and the end effector) as a unit through the removal of a single fastener from the top side of the end effector.

Referring to FIG. 5F another example of a roller arrangement 500" is shown. The roller arrangement 500" may be substantially similar to roller arrangement 500' unless otherwise noted. In this example, the pusher 900" includes an aperture 900A and the inner retention ring 905" includes retaining features that correspond to fastener 907. Here the bearing assembly 902, 904, 905" is mounted to the pusher 900" through the insertion of fastener 907 through the aperture 900A from an underside of the end effector for engagement with the inner retention ring 905". As may be realized, in this example, the bearing assembly 902, 904, 905" and the roller 901' may be removed from the pusher 900' (and the end effector) as a unit through the removal of a single fastener from the underside of the end effector.

Figure 6:
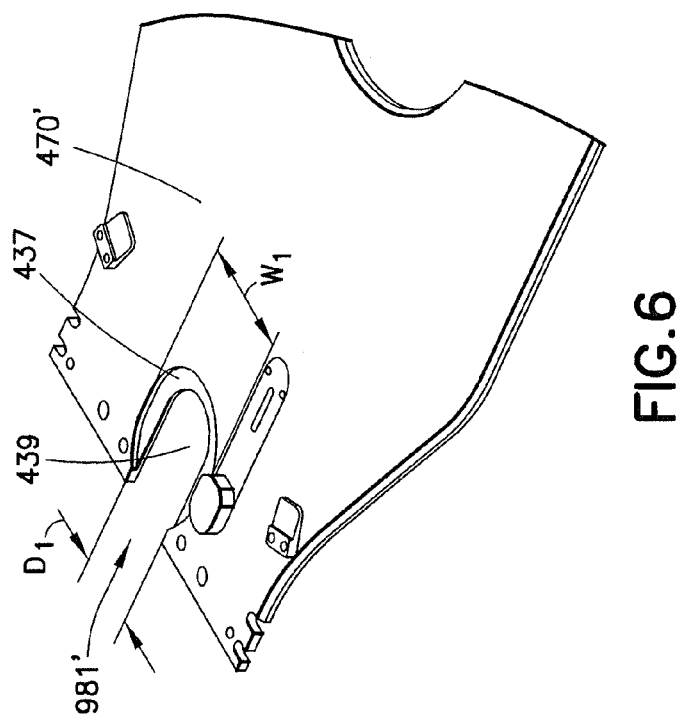
FIG. 6 is a partial perspective view of a portion of an end effector in accordance with an aspect of the invention.

The height 910 of the roller arrangement 500 above an upper surface 912 of the base 470 is such that the end effector 203 (which may include stacked substrate supports as shown in FIG. 3) is configured to simultaneously pick or place multiple substrates from and to adjacent slots in, for example, a FOUP or other suitable substrate holding location where the pitch between the adjacent slots is about, for example, 10 mm. In alternate embodiments the pitch between the adjacent substrate holding slots may be any suitable pitch. In one example, the roller 901 (or other suitable pivotable, rotatable or otherwise movable substrate contact member such as that described below with respect to FIG. 8) and/or substrate support 470 may include one or more recessed areas 980, 981. These recessed areas 980, 981 may be configured to accept or otherwise at least partially house one or more features of the mounting structure for mounting the substrate contact member to the pusher 900. For exemplary purposes only the recessed areas 980, 981 will be described with respect to roller 901 but is should be understood that the recessed areas may be applied to any suitable rotatable/pivotable substrate contact member and its mounting features. As can be seen in FIG. 5C, the outer retention ring 904, the inner retention ring 905, the bearing 902 and fasteners 907, 915 may be at least partially housed or otherwise inserted within recess 980 of the roller 910. As an example, the outer retention ring 904 may be secured to the pusher 900 by the fasteners 915 and the roller 901 may be configured, via the recess 980, to fit over (e.g. cover) the outer retention ring 904 (as well as the bearing 902, inner retention ring 905 and other suitable components of the roller mounting structure) so that these features of the mounting structure are inserted into the recess 980 when the roller is secured to the pusher 900. The substrate support 470 may also include one or more recesses 981 into which at least one of the pusher 900 and at least part of the roller 901, 901', 901" are inserted. Referring also to FIG. 4A the recess 981 includes an aperture located in the substrate support 470. The aperture may be sized to provide access to a bottom of the pusher 900, 900', 900" and roller arrangement 500, 500', 500". In one example, the aperture may be sized such that the roller 901, 901', 901" can pass through the aperture by removing the fasteners that secure the roller/bearing assembly to the pusher 900, 900', 900" and then passing the roller/bearing assembly through the aperture 470R between the pusher and the edge of the aperture 470R. Referring also to FIG. 6, another example of a recess 981' is shown. The recess 981' may have a stepped configuration. For example, the recess 981' may include a recess portion 437 and an aperture portion 439. The aperture portion 439 may be sized such that at least a portion of the pusher 900, 900', 900" is allowed to move back and forth between the edges of the aperture where a distance between the edges D1 is smaller than a diameter of the roller 901, 901', 901". The recess portion 437 may have a width W1 that is greater than the diameter of the roller 901, 901', 901" to allow at least a portion of the roller to move back and forth within the recess portion 437. It is noted that the rollers may also include one or more recesses (see e.g. recesses 980A, 980B in roller 901 in FIG. 5C). One or more of the recesses 980A, 980B, 981 may interact with one or more protrusions 966 of the pusher or each other so as to form a labyrinth seal arrangement (as shown in FIG. 5C) to substantially prevent particulate matter, that may be generated by, for example, bearing 902, from migrating outside and below the roller arrangement 500. The recesses 980A, 980B, 981 and the insertion of at least part of the mounting features into one or more recesses of the substrate contact member may effect a compact height 910 of the substrate pusher arrangement for allowing, for example, stacked substrate holders (as shown in FIG. 3) and/or single substrate holders to be inserted into substrate holding locations where the pitch between these substrate holding locations is about, for example, 10 mm.

Figure 8:
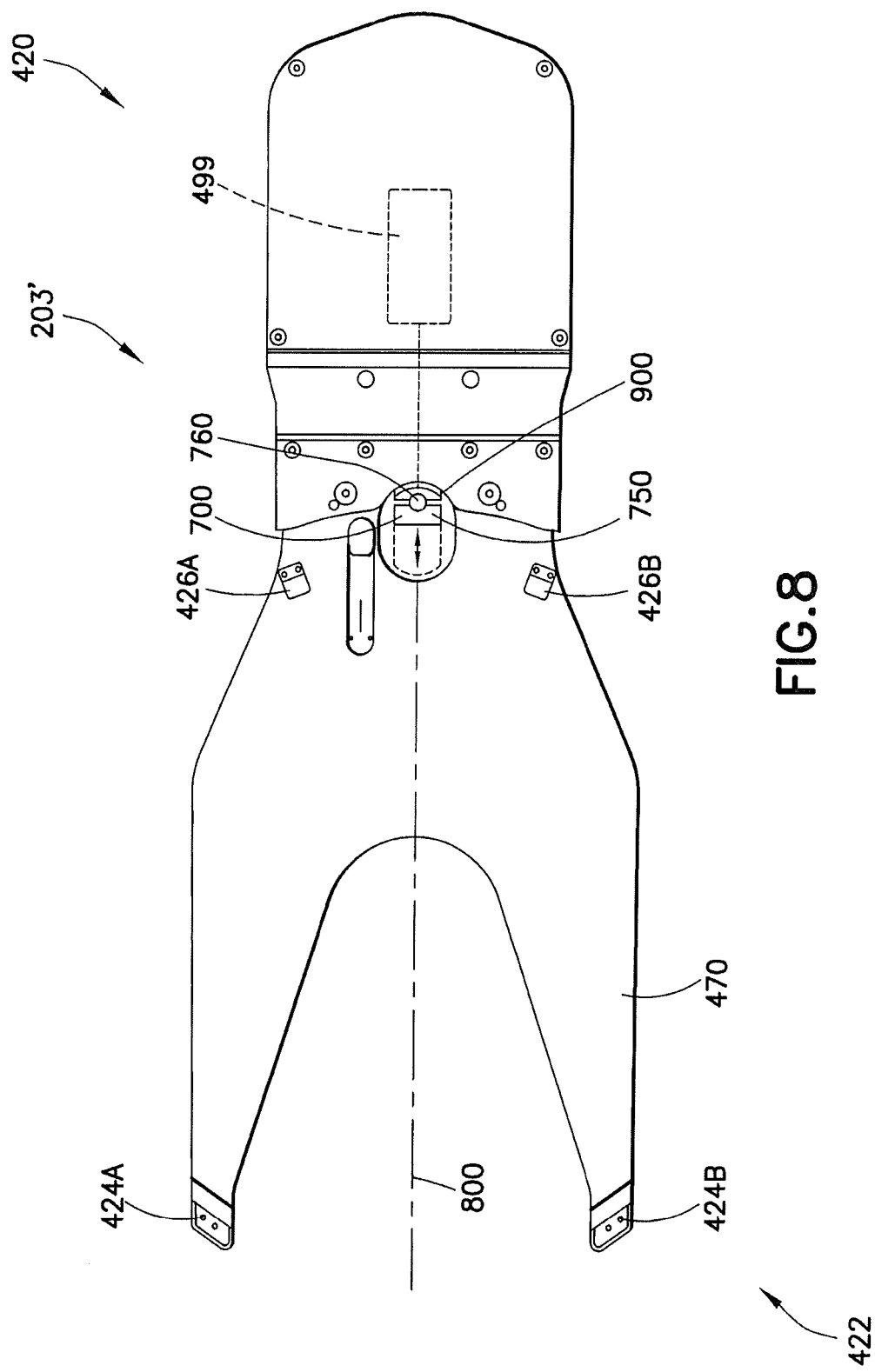
FIG. 8 is a schematic plan view of an end effector in accordance with an aspect of the invention.

Referring to FIG. 8, another exemplary embodiment of an end effector 203' is shown. The end effector 203' may be substantially similar to end effector 203 such that like features are similarly numbered, unless otherwise noted. In this example, the end effector 203' includes a release contact arrangement 700 for effecting moving the substrate, such as substrate 412, toward the distal end of the substrate support 470. The release contact arrangement 700 may include pusher 900, a release mechanism 760 and a contact member 750. The contact member 750 may be mounted to the pusher 900 through the release mechanism 760 so that the contact member 750 is movably (e.g. pivotally) mounted on the pusher 900. For example, the release mechanism may be a hinge, bearing, or other suitable releasable or otherwise pivotable or movable interface or joint that allows movement (e.g. rotation) of the contact member 750 relative to the pusher 900. In one exemplary embodiment, the contact member 750 may include a substantially flat substrate contact surface having a contour substantially similar to that described above with respect to the roller 901. In alternate embodiments the contact member may be an arm or other member (e.g. pivotally coupled to the pusher 900) having any suitable shape and configuration for contacting the substrate and moving the contact region between substrate and contact member for effecting the gripping of the substrate in a manner substantially similar to that described herein. The release contact arrangement 700 may operate in a manner substantially to that described herein for the roller arrangement 500, however, instead of rotating the contact member 750 pivots to direct the force $F_R$ (FIG. 7) for effecting the rolling of the substrate as will be described below. In alternate embodiments, a release contact device substantially similar to contact member 750 and release mechanism 760 may be provided on, for example, one or more of the distal rest pads 424A, 424B for allowing the rolling of the substrate for substantially completely seating the substrate against the distal rest pads 424A, 424B in a manner substantially similar to that described herein.

Referring to FIG. 7, the geometry of the end effector 203 and its rest pads 426A, 426B, 424A, 424B and roller arrangement 500 are configured to account for the presence of an alignment fiducial 412F on the edge of the substrate 412, which may otherwise affect the direction of force exerted on the substrate by the pusher roller 901. When the substrate 412 is loaded on the end effector 203 (e.g. lifted from a substrate holding location) the substrate is generally offset by a distance E from the longitudinal axis 800 of the end effector 203. The offset location of the substrate is illustrated by substrate 412 in FIG. 7. As the roller 901 is moved towards the distal end 422 of the end effector 203 (via the actuator 499 and pusher 900) to clamp or grip the substrate 412, the substrate 412 is pushed to slide on the rest pads toward the distal end 422 of the end effector 203 until the edge of the substrate 412 contacts a hard stop of one of the distal rest pads 424A, 424B. In this example, for exemplary purposes only, the substrate 412 is shown as first contacting the hard stop (e.g. surface 434, 434' or a combination of surfaces 434' and 442) of rest pad 424B but it should be understood that similar substrate motion and forces occur in a substantially similar manner when the substrate 412 first contacts rest pad 424A during initial gripping of the substrate 412. As the roller 901 moves further towards the distal end 422 of the end effector 203 for clamping the substrate 412, the substrate 412 rolls along the hard stop of rest pad 424B until the substrate 412 is seated against the hard stop of the other distal rest pad 424A. The seated substrate (e.g. substantially seated against both distal rest pads 424A, 424B) is represented by substrate 412' in FIG. 7. In this example, the rolling motion of the substrate 412 is effected by the rotation of the roller 901, which transmits the force from the pusher 900 to the substrate 412.

To effect rolling of the substrate 412 along one of the distal rest pads 424A, 424B as described above, the force $F_R$ exerted on the substrate 412 by the roller 901 produces a moment in either the clockwise or counterclockwise direction (depending on which distal rest pad 424A, 424B is contacted first). The geometric relation between the rest pads 424A, 424B and roller 901 is such that the direction of the force $F_R$ exerted on the substrate 412 by the roller 901 points to the right or left (depending on which distal rest pad 424A, 424B is contacted first) of the point of contact (such as point of contact PC on rest pad 424B) between the edge of the substrate 412 and the hard stop of the corresponding rest pad 424A, 424B. In this example, as can be seen in FIG. 7, the force $F_R$ is pointing to the right of the point of contact PC between the substrate 412 and the rest pad 424B so that a moment is produced that causes the substrate 412 to roll towards rest pad 424A (if the rest pad 424A were contacted first the force $F_R$ would point to the left of the point of contact so the substrate rolls towards rest pad 424B). In addition, the distance between the force vector $F_R$ and the point of contact PC between the edge of the substrate 412 and the hard stop of, in this example, rest pad 424B is such that the moment created overcomes the resistance forces F1-F3 associated with, for example, the friction between the substrate 412 and one or more of the proximate and distal rest pads 426A, 426B, 424A, 424B. These conditions can be expressed as follows:

$$E + W + \frac{\left(\sqrt{R_S^2 - X^2} + R_S + R_R\right)}{\tan\phi} > 0 \quad [1]$$

$$E + W + \frac{\left(\sqrt{R_S^2 - X^2} + R_S + R_R\right)}{\tan\phi} > \frac{M}{F_A} \quad [2]$$

where, $$\phi = \frac{\pi}{2} + \sin^{-1}\left(\frac{E}{\sqrt{R_S^2 - W^2} + \sqrt{R_R^2 - W^2}}\right) + \tan^{-1}\left(\frac{W}{R_R}\right) \quad [3]$$

and

E is the maximum allowable substrate offset (in meters), $F_A$ is the actuation force acting on the pusher roller 901 (in Newtons), M is the moment against substrate rotation (in Newton-meters), $R_R$ is the radius of the roller 901 (in meters), $R_S$ is the radius of the substrate (in meters), W is half of the alignment fiducial 412F width (in meters) and X is the offset of nominal tip contact point (in meters).

The disclosed embodiments provide an end effector having a gripper with a single roller pusher arrangement. The geometry of the gripper/end effector substantially provides proper operation in the presence of an alignment fiducial on the substrate edge, and the mechanical design complies with space constraints between stacked end effectors, enabling multiple simultaneous pick/place operations.

In one exemplary embodiment a robotic arm end effector apparatus is provided for gripping a substrate on its peripheral edge. The end effector includes a substrate support having proximate and distal ends. At least one distal rest pad is disposed at the distal end of the substrate support, the at least one distal rest pad includes a back stop portion and is configured to support the peripheral edge of the substrate. At least one proximate rest pad is disposed at the proximate end of the substrate support, the at least one proximate rest pad being configured to support the peripheral edge of the substrate. An active contact member assembly is disposed at a proximate end of the substrate support and includes a pusher member, a contact member and a rotatable coupling member that are reciprocably movable towards the distal end of the substrate support for urging the substrate against the back stop portion of the at least one distal rest pad, the contact member being movably secured to the pusher by the rotatable coupling member.

It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:
1. An apparatus for gripping a substrate on its peripheral edge, the apparatus comprising:
    a substrate support having proximate and distal ends;
    at least one distal rest pad disposed at the distal end of the substrate support, the at least one distal rest pad includes a back stop portion and is configured to support the peripheral edge of the substrate;

at least one proximate rest pad disposed at the proximate end of the substrate support, the at least one proximate rest pad being configured to support the peripheral edge of the substrate; and an active contact member assembly disposed at the proximate end of the substrate support, the active contact member assembly including a pusher member, a contact member and a rotatable coupling member that are substantially linearly reciprocably movable towards the distal end of the substrate support for urging the substrate against the back stop portion of the at least one distal rest pad, the contact member being movably secured to the pusher member by the rotatable coupling member so that the contact member is substantially free to rotate about a center axis of the rotatable coupling member substantially on contact with the substrate and a center axis of the rotatable coupling member is aligned with an axis of the pusher member.

2. The apparatus of claim 1, wherein the contact member comprises a roller.

3. The apparatus of claim 1, wherein the contact member comprises a pivot member.

4. The apparatus of claim 1, wherein the rotatable coupling member and the contact member are removable as a unit from the pusher member.

5. The apparatus of claim 4, wherein the rotatable coupling member and the contact member are removable as a unit through a removal of a single fastener configured to couple the rotatable coupling member to the pusher member.

6. The apparatus of claim 1, wherein the contact member is configured to allow relative movement between the contact member and the substrate as the substrate is urged against the back stop portion of the at least one distal rest pad.

7. The apparatus of claim 1, wherein the apparatus includes at least two substrate supports stacked one above the other, each of the at least two substrate supports having a respective active contact member assembly.

8. The apparatus of claim 1, wherein the active contact member assembly includes a labyrinth seal arrangement configured to substantially seal the rotatable coupling member from an environment in which the substrate support is located.

9. The apparatus of claim 1, wherein the substrate support includes a base portion and at least the contact member is removable from the apparatus without disassembly of any one of the substrate support and base portion.

10. The apparatus of claim 1, wherein the rotatable coupling member includes a first portion and a second portion that are movable relative to each other, wherein the contact member is keyed to one of the first portion or second portion to substantially prevent relative movement between the contact member and the one of the first portion or second portion.

11. An end effector for a substrate transport, the end effector comprising:

a base portion;

a substrate holding portion having a proximate end and a distal end, a longitudinal axis extending between the proximate end and distal end, and at least one rest pad, the substrate holding portion being coupled to the base portion a the proximate end and extending from the base portion;

an active contact member assembly disposed at the proximate end of the substrate holding portion, the active contact member assembly including a pusher member, a contact member and a rotatable coupling member that are reciprocably movable towards the distal end of the substrate holding portion for gripping a substrate on the substrate holding portion, the contact member being movably secured to the pusher member by the rotatable coupling member such that a center axis of the rotatable coupling member is aligned with an axis of the pusher member and being configured to contact the substrate for urging the substrate against the at least one rest pad and to rotate about the center axis of the rotatable coupling member in response to rotation of the substrate during gripping and while in substantial contact with the substrate where the center axis of the rotatable coupling member is substantially along the longitudinal axis.

12. The end effector of claim 11, wherein the at least one rest pad comprises at least one distal rest pad disposed at the distal end of the substrate support, the at least one distal rest pad includes a back stop portion and is configured to support the peripheral edge of the substrate, where the active contact member is configured to urge the substrate against the back stop portion of the at least one distal rest pad.

13. The end effector of claim 12, wherein the rotatable coupling member and the contact member are removable as a unit from the pusher member.

14. The end effector of claim 13, wherein the rotatable coupling member and the contact member are removable as a unit through a removal of a single fastener configured to couple the rotatable coupling member to the pusher member.

15. The end effector of claim 1, wherein the contact member is configured to rotate about the axis of the rotatable coupling member in response to a transverse force, relative to a direction of reciprocation of the contact member, applied to the contact member by the substrate.

16. The end effector of claim 1, wherein at least the contact member is removable from the end effector without disassembly of any one of the substrate holding portion and base portion.

17. An end effector for a substrate transport having a longitudinal axis extending between a distal and a proximate end of the end effector, the end effector comprising:

a substrate support having at least two substrate rest pads for supporting a peripheral edge of a substrate; and an active contact member reciprocably moveable along the longitudinal axis and configured to urge the substrate against the at least two substrate rest pads, the active contact member having a pusher member and a rotatable member rotatably coupled to the pusher member, the rotatable member being configured to contact the substrate allowing relative movement between the active contact member and the substrate while in substantial contact with the substrate so that the substrate can pivot about one of the at least two substrate rest pads during gripping of the substrate and an axis of rotation of the rotatable member is aligned with an axis of the pusher member.

18. The end effector of claim 17, wherein the rotatable member comprises a roller or pivotal member that reciprocates toward and away from the at least two substrate rest pads.

19. The end effector of claim 18, wherein the pusher member is coupled to a reciprocating drive unit.

20. The end effector of claim 17, wherein the active contact member is removable from the end effector without disassembly of the end effector.

* * * * *